United States Patent [19]

Fett

[11] 4,048,626
[45] Sept. 13, 1977

[54] MEMORY DEVICE
[75] Inventor: Darrell L. Fett, Scottsdale, Ariz.
[73] Assignee: Honeywell Information Systems Inc., Waltham, Mass.
[21] Appl. No.: 644,658
[22] Filed: Dec. 29, 1975
[51] Int. Cl.² .............................................. G11C 11/40
[52] U.S. Cl. ................................ 340/173 R; 307/238; 340/173 SP
[58] Field of Search ...................... 340/173 R, 173 SP
[56] References Cited
U.S. PATENT DOCUMENTS

| 3,812,478 | 5/1974 | Tomisawa | 340/173 R |
| 3,890,602 | 6/1975 | Tomisawa | 340/173 R |

Primary Examiner—Terrell W. Fears
Attorney, Agent, or Firm—Ronald T. Reiling; Nicholas Prasinos

[57] ABSTRACT

A READ ONLY memory is disclosed wherein the bits of a given word are separately stored in a number of individual storage arrays. The individual storage arrays each contain a plurality of addressable bit storage locations. These bit storage locations are first accessed and thereafter sensed in response to a given address. The accessing and sensing is implemented by current mode logic in a manner which effectively develops and thereafter utilizes various current paths.

23 Claims, 2 Drawing Figures

MEMORY DEVICE

BACKGROUND OF THE INVENTION

1. Field of the Invention

This invention relates to electronic memories used for storing digital data. In particular, this invention relates to the storage of digital data in a READ ONLY type of memory.

2. Description of the Prior Art

READ ONLY memories have been widely used in various portions of digital computers wherein it is necessary to quickly access pieces of stored information. READ ONLY memories differ from other types of memory in that they usually minimize the time necessary to access such stored information. This is accomplished by constructing these memories from electronic circuitry capable of providing the requisite fast response characteristic. Heretofore, these electronic memories have required significant power to operate the circuitry in such a manner as to be quickly responsive. This has often required a considerable amount of electronic apparatus in the form of transistor circuitry to accomplish the same. This transistor circuitry has usually taken the form of TTL or MOS logic.

OBJECTS OF THE INVENTION

It is an object of this invention to provide a new and improved READ ONLY memory.

It is another object of this invention to provide a READ ONLY memory which is both low powered and conservative on energy.

It is still another object of this invention to provide a new and improved READ ONLY memory having current mode logic wherein the current utilized within the memory is effectively utilized.

SUMMARY OF THE INVENTION

These and other objects of the invention are realized by providing a READ ONLY memory which is implemented according to current mode logic. In a preferred embodiment, the READ ONLY memory is organized into 10 individual bit arrays wherein each bit array contributes a particular bit to a 10-bit word.

The bits are accessed within each array by an eight-bit address that defines a particular matrix location within each array. Data is stored at each matrix location according to whether or not there is a presence or absence of an emitter contact at the addressed location. This storage condition is sensed by current mode logic originating from an address decoding device wherein the X and Y locations within the matrix are uniquely decoded and thereafter sensed.

BRIEF DESCRIPTION OF THE DRAWINGS

For a better understanding of the present invention, reference should be made to the accompanying drawings wherein.

DESCRIPTION OF THE PREFERRED EMBODIMENT

Figure 1:
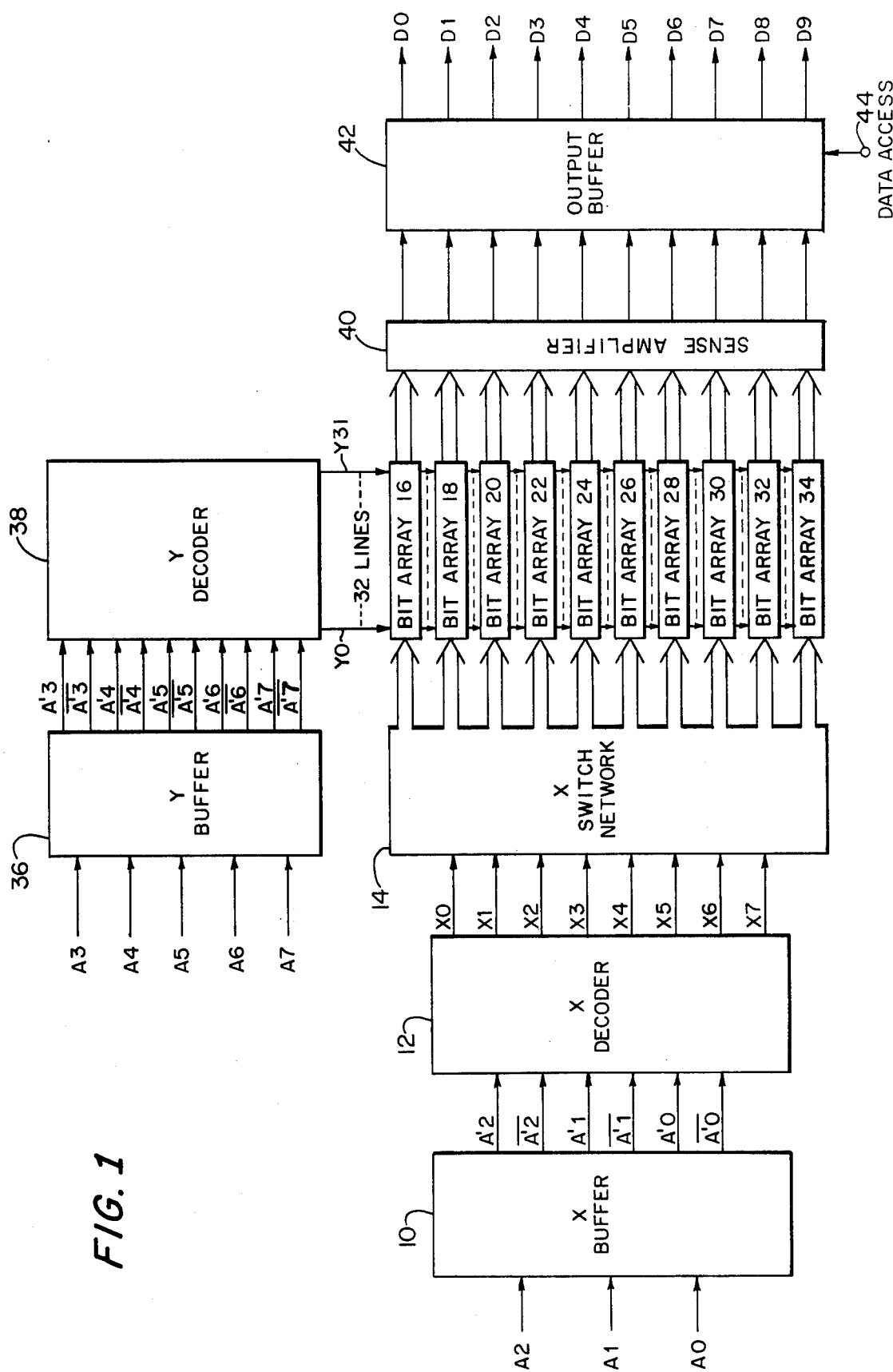
FIG. 1 schematically depicts the READ ONLY memory in block diagram form.

Referring to FIG. 1, the READ ONLY memory receives an eight-bit address identified by the address signals A0 through A7. The address signals A0 through A7 are bi-level signals wherein the higher level arbitrarily represents a ZERO address bit and the lower level arbitrarily represents a ONE address bit.

The X address signals, A0 through A2 are applied to an X-buffer 10 which generates six separate signals to an X-decoder 12. These six separate signals represent current mode logic assertions and negations of the original X address signals and are accordingly identified as A'0, $\overline{A'0}$, etc. These particular signal conditions will be explained in detail hereinafter. The X-decoder 12 energizes its eight outputs X0 through X7 in a manner which activates only one of eight switches within each of 10 individual switch sets in an X switch network 14. Each individual switch set is in turn connected to a bit array 16 through 34.

The Y address signals, A3 through A7 are applied to a buffer denoted as 36. The Y-buffer 36 generates ten separate signals representing the current mode logic assertions and negations of the five original Y-address signals. These signals are denoted as A'3, $\overline{A'3}$ through A'7, $\overline{A'7}$. The 10 separate signals from the Y-buffer 36 are applied to a Y-decoder 38 which selects one of 32 Y lines denoted as Y0 through Y31. The 32 Y lines each thread through the 10-bit arrays 16 through 34. These 32 lines combine with eight X-lines from each set of X switches to form 256 bit storage locations within each bit array.

According to the invention, one and only one Y line is energized at any one time, whereas each of the 10 sets of X switches within X switch network 14 activates a particular X line in each bit array. The addressed location which is thereby energized in each bit array is sensed for its particularly stored bit by a sense amplifier 40. The sensed bit from each bit array is applied to an output buffer 42 so as to result in bits 0 through 9 being present therein. These bits are made available as data bits D0 through D9 when the output buffer 42 is enabled by a DATA ACCESS signal appearing at a terminal 44.

Figure 2:
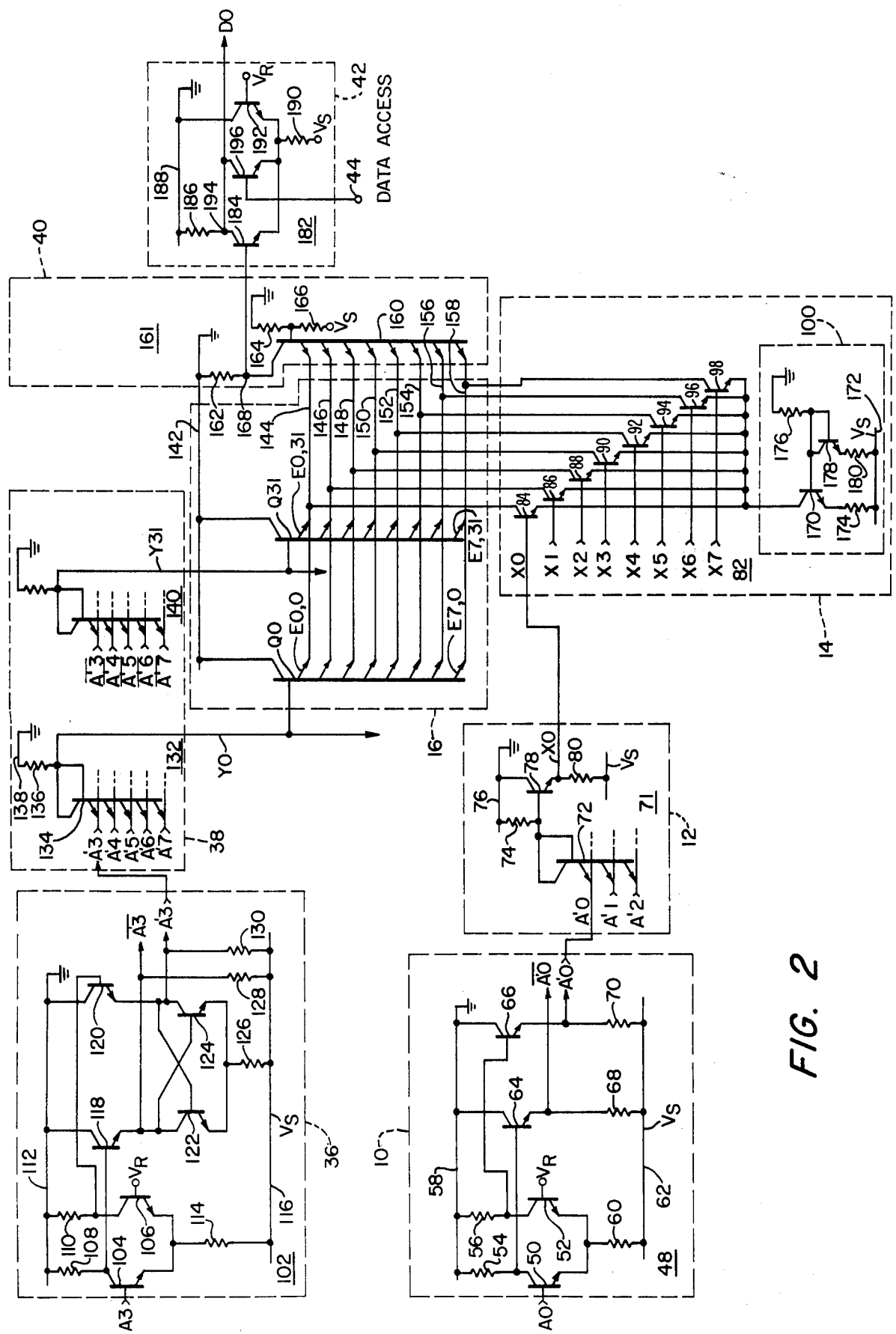
FIG. 2 illustrates the detailed electronic elements of the block diagram READ ONLY memory of FIG. 1.

Referring now to FIG. 2, wherein the READ ONLY memory of FIG. 1 is shown in greater detail with the various elements of FIG. 1 being depicted in dotted outline form. Before discussing the various elements in detail, it is first of all to be noted that each operates according to current mode logic principles wherein the presence or absence of current denotes a logical binary condition.

Beginning again with the application of the address signals A0 through A7, it is first seen that the address signal A0 is applied to a buffer circuit 48 within the X buffer 10. This buffer circuit represents one of three identical buffer circuits, each of which receives one of the particular X address signals A0 through A2 at its input. In this regard, it is seen that the address signal A0 is applied to the base of an input transistor 50 which is differentially coupled with a transistor 52. The base of the transistor 52 is biased by a reference voltage $V_R$ which is set between the two voltage levels of the address signal A0. The collectors of the differentially coupled transistors 50 and 52 are connected via resistors 54 and 56 to a ground bus 58 whereas their respective emitters are coupled through a resistance 60 to a negative voltage bus 62 having a relatively negative supply voltage denoted as $V_S$.

The points upstream of the collectors of the differentially coupled transistors 50 and 52 are connected to the bases of emitter-follower transistors 64 and 66 as shown. The collectors of the emitter-follower transistors 64 and 66 are connected to the ground bus 58 whereas their emitters are connected through resistors 68 and 70 to the negative voltage supply bus 62. The emitter outputs of the emitter follower transistors 64 and 66 constitute the output of the buffer circuit 48. The signal conditions present at the outputs are denoted as A'0 and $\overline{A'0}$.

The operation of the X-buffer circuit 48 will now be described by assuming the A0 address bit is ZERO. The address signal A0 will therefore be relatively higher than the $V_R$ reference voltage applied to the base of the transistor 52. This will cause the transistor 50 to conduct thereby lowering the base voltage at the emitter follower transistor 64. At the same time, the base of the emitter-follower transistor 66 will go high by virtue of transistor 52 being non-conductive. This will result in the emitter output of the transistor 66 being high whereas the emitter output of the transistor 64 will be low. The relatively lower signal condition A'0, at the emitter output of transistor 64 will result in a current pull on the X decoder 12. On the other hand, the relatively high signal condition of $\overline{A'0}$ at the output of the emitter follower transistor 66 will not exert a current pull on the X decoder 12.

The X decoder 12 is shown with only one of the eight particular decode circuits that occur within it. The decode circuit 71 begins with a multi-emitter transistor 72 that is emitter-connected to the A'0 output of the X buffer 10 as well as the A'1 and A'2 outputs thereof. The collector and base of the multi-emitter transistor 72 are commonly connected through a resistor 74 to a ground bus 76, as well as to the base of a transistor 78. The emitter of the transistor 78 is connected through a resistor 80 to the negative supply voltage $V_S$ whereas the collector is connected to the ground bus 76. The emitter output of the transistor 78 constitutes the output of the decode circuit 71.

The operation of the decode circuit 71 will now be briefly described. The multi-emitter transistor 72 will normally be in a conductive state if any of the emitter signal conditions A'0 through A'2 create a current pull effect. As has been previously noted, such a current pull will come from the outputs of the buffer circuits such as 48 within the buffer 10. If the multi-emitter transistor 72 experiences current pull and is hence conductive, then the base of the transistor 78 will be drawn low thereby causing the voltage at its emitter output to go low. This will cause the output signal condition X0 to be relatively low.

In order for the output signal condition X0 to go high, each of the signal conditions A'0, A'1 and A'2 must not impose a current pull effect on the emitters of the multi-emitter transistor 72. With no current pull on any emitter, the multi-emitter transistor will be rendered non-conductive, hence causing the base voltage of the transistor 78 to go high thereby causing the voltage at its emitter output to go high.

It is to be noted that only one of the particular X decode circuits has been illustrated. This particular circuit governs the X0 output of the decoder 12. The decoding was possible by virtue of applying signal conditions to the various emitters of the multi-emitter 72 so as to not produce a current pull effect on any of the various emitters thereby causing the X0 output to go high. In a similar manner, the various other decoder circuits for the outputs X1 through X7 will have combinations of emitter conditions on their corresponding multi-emitters that will not produce a current pull through the particular multi-emitter when that particular X output is to be activated. This is accomplished by normally applying the current mode logic assertions of the address signals A0 through A2, except when the presence of a binary ONE in a particular address bit would denote part of the total binary address for the particular X output. In this latter case, the current mode logic negation of the particular X address bit is imposed on the respective emitter. In this regard, the signal conditions on the multi-emitter for the X1 decoder circuit would be $\overline{A'0}$, A'1 and A'2, whereas the signal conditions on the X7 decoder circuit would be $\overline{A'0}$, $\overline{A'1}$ and $\overline{A'2}$.

The various outputs, X0 through X7 from the X-decoder circuit 12, are applied to a set of switching transistors 82 within the X switch network 14. The X switch set 82 constitutes one of 10 switch sets within the X switch network 14. The X switch set 82, connects to the bit array 16, whereas the other nine switch sets, which are not shown, connect to the corresponding bit arrays 18 through 34 of FIG. 1.

The X switch set 82 comprises switching transistors 84 through 98, each of which have an emitter connected to a current sink 100. The collectors of each of the respective switching transistors 84 through 98 are connected to the bit array 16.

The operation of the X switch set 82 is such as to exert a current pull effect on the bit array 16 by only one of the switching transistors 84 through 98. The particular switching transistor to exert this current pull effect is activated by the corresponding X output from the X-decoder circuit 12 that is relatively high. In other words, when the X0 output is high, the switch transistor 84 will be on thereby exerting a current pull effect on the bit array 16. It is to be understood that the remaining switching transistors 86 through 98 will be inactive by virtue of their respective base voltage conditions of X1 through X7 being relatively low.

While the bit array 16 thus experiences certain current pull effects from the X switch set 82, it is also subject to certain current conditions imposed by the Y-buffer 36 working in conjunction with the Y-decoder 38. It is appropriate to discuss both of these Y elements before dealing any further with the bit array 16.

The Y-buffer 36 is seen to comprise a circuit 102 which receives the A3 address signal and generates the two current pull signal conditions A'3 and $\overline{A'3}$. It is to be noted that the circuit 102 is merely one of five similar circuits each of which is devoted to a particular Y address signal A3 through A7.

The circuit 102 is seen to consist of differentially paired transistors 104 and 106 having collectors connected through resistors 108 and 110 to ground bus 112, and emitters connected through resistor 114 to negative voltage bus 116. The base of the transistor 104 receives the input address signal A3 which is logically high for a ZERO address bit. The base of the transistor 106 is biased by a reference voltage $V_R$ which is lower than the voltage level of the signal A3 for a binary ZERO. Points upstream of the collectors of the transistors 104 and 106 are respectively connected to the bases of emitter-follower transistors 118 and 120. The collectors of emitter followers 118 and 120 are connected to the ground bus 112 whereas their respective emitters are connected to a set of cross-coupled transistors 122 and 124. The cross-coupled transistors 122 and 124 are connected through a resistor 126 to the negative voltage bus 116. The outputs A'3 and $\overline{A'3}$ of the circuit 102 are upstream of the cross-coupled transistors 122 and 124.

These outputs are connected to the negative voltage bus 116 through the resistors 128 and 130.

The operation of the circuit 102 is somewhat similar to that of the X-buffer circuit 48, with the exception of the contribution by the cross-coupled transistors 122 and 124. In this regard, the differentially-paired transistors 104 and 106 will alternately conduct depending on the signal level of the address signal A3. Depending on which differentially-paired transistor is thus conducting, either emitter-follower transistor 118 or 120 will be conductive, thereby activating the base of the corresponding cross-coupled transistor 122 or 124. The resulting activated transistor 122 or 124 will pull current through its collector so as to cause a current pull effect on the respective output A'3 or $\overline{A'3}$.

It is important to note that the above is accomplished by virtue of the emitter-follower transistors 118 and 120 sharing a common emitter current that is switched between them by virtue of the cross-coupled transistors 122 and 124. In this regard, more current flows through either transistor 118 or 120 depending on which one has been made appropriately conductive by virtue of the differentially-paired transistors 104 and 106.

Turning now to the Y-decoder 38 wherein a decoder circuit 132 has been particularly illustrated. In this regard, it is to be noted that there are 31 similar circuits within the Y-decoder 38, each of which decodes certain current pull signal conditions from the Y-buffer 36. The particular decoder circuit 132 which is illustrated will provide appropriate decoding for the Y0 conductor.

The Y-decoder circuit 132 comprises a multi-emitter transistor 134 having its five emitters connected to certain outputs from the Y-buffer 136. The multi-emitter transistor 134 moreover has both its collector and base connected through a resistor 136 to a ground bus 138. A conductor Y0 is also commonly connected to the resistor 136 so as to draw current when the multi-emitter transistor 134 is not conducting. In this regard, the multi-emitter transistor 134 will not conduct when each of its five emitters does not experience a current pull from the corresponding outputs of the Y-buffer 36. The current pull signal conditions imposed upon the emitters of the multi-emitter transistor 134 are seen to be: A'3, A'4, A'5, A'6, and A'7. It is to be appreciated that all five signal conditions must not produce a current pull on their respective emitters in order to prevent the multi-emitter transistor 134 from becoming conductive. When the transistor 134 is thus rendered non-conductive, the conductor Y0 will be appropriately energized.

The decoder circuit 140 for the Y31 conductor is also depicted. In this regard, the current pull signal conditions on the multi-emitter transistor of the decoder circuit 140 are seen to be $\overline{A'3}$, $\overline{A'4}$, $\overline{A'5}$, $\overline{A'6}$, and $\overline{A'7}$. It is to be realized that all of these current pull signal conditions have to be off before the Y31 conductor will be energized in the same manner as has been explained for the Y0 conductor.

It is to be appreciated that the current pull signal conditions imposed on each multi-emitter transistor within each respective Y-decode circuit is such as to only allow one Y conductor to be energized from among the 32 Y conductors. This is accomplished by normally applying the current mode logic assertions of the address signals A3 through A7 except when the presence of a binary ONE in a particular address bit would denote part of the total binary address for the particular Y conductor. In this latter case, the current mode logic negation of the particular Y address bit is imposed on the respective emitters. Hence, the decoder circuit for the Y31 conductor receives all current mode logic negations whereas the Y0 decoder circuit for the conductor receives all assertions.

The conductors Y0 through Y31 are connected to the bases of a set of multi-emitter transistors Q0 through Q31 within the bit array 16. Due to space limitations, only the transistors Q0 and Q31 are actually shown. Each of the multi-emitter transistors Q0 through Q31 have their collectors connected to a ground bus 142. The emitters of the respective transistors Q0 through Q31, namely, E0,0 through E0,31, are either conductively connected or conductively open with respect to a set of emitter lines 144 through 158. An open emitter connection is arbitrarily defined as storing a ZERO bit whereas a closed conductive emitter connection is arbitrarily defined as storing a ONE bit.

The emitter lines 144 through 158 are each respectively connected to a collector of one of the X switching transistors 84 through 98. These switching transistors have been previously described in connection with the X switch set 82.

The emitter lines 144 through 158 also exit from the bit array 16 and connect to the emitters of a multi-emitter transistor 160 within a sense amplifying circuit 161. The sense amplifying circuit 161 constitutes only one of ten such sense amplifying circuits within the sense amplifier 40. In this regard, each of the separate sense amplifying circuits is integrally connected to one of the corresponding bit arrays 18 through 34 of FIG. 1.

The collector of the multi-emitter transistor 160 is connected to the ground bus 142 through a resistor 162. The base of the multi-emitter transistor 160 is biased by a reference voltage established by a resistor 164 to ground and a resistor 166 to the negative voltage $V_S$. This reference voltage is defined relative to the base voltage of the multi-emitter transistors Q0 through Q31 so as to cause the multi-emitter transistor 160 to conduct when the transistors Q0 through Q31 are non-conducting.

When the multi-emitter transistor 160 is conducting, a current path is established from the ground bus 142 through the resistor 162 and the transistor 160 to one of the emitter lines 144 through 158 and thereafter through one of the X switching transistors 84 through 98 to the current sink 100. The current sink 100 must be constructed so as to pull sufficient current through the resistor 162 so as to thereby cause a significant voltage change at a point 168 downstream of this resistor. The point 168 constitutes the output of the sense amplifying circuit 161. The structure of the current sink 100 which accomplishes this result begins with a transistor 170 that connects to a ground bus 172 through a resistor 174. The base voltage of the transistor 170 is defined by a resistance 176 to ground and a transistor 178 having both its collector and base connected to the resistance 176 as well as having its emitter connected through a resistance 180 to the negative voltage bus 172.

The integral operation of the sense amplifying circuit 161 with respect to the bit array 16 occurs when a particular addressed location within the bit array 16 has been appropriately energized by activating the corresponding Y conductor and X switching transistor for that location. As has been previously indicated, a conductive path from the Y conductor to the X switching transistor will either be closed or open depending on the stored information at the addressed location. In the event that a ONE bit has been stored, an emitter connection will occur at the particular addressed location, thus resulting in a conductive path through the associated emitter line to the X switching transistor and hence to the current sink 100. With a particular one of the multi-emitter transistors Q thus being conductive, the multi-emitter transistor 160 within the sense amplifying circuit 161 will be non-conductive. This will raise the voltage level at the output point 168 downstream of the resistor 162. In other words, the output voltage level from the sense amplifying circuit 161 will be high when a particularly sensed location contains a ONE bit.

It is to be appreciated that if a ZERO bit has been stored at a particular addressed location, then there will be an open conductive path at the particular E emitter so as to cause the corresponding Q transistor to be non-conductive thereby allowing the multi-emitter transistor 160 to conduct. With the multi-emitter transistor 160 conducting through an emitter line to the particular activated X switching transistor and thereafter to the current sink 100, the voltage level at the output point 168 will drop. In this instance, the lower voltage level at the output point 168 signifies the sensing of a ZERO bit at the particular addressed location.

The output of the sense amplifying circuit 161 is applied to a buffer circuit 182 within the output buffer 42. It is to be understood that the buffer circuit 182 represents one of 10 such buffer circuits, each of which is connected to a respective sense amplifying circuit within the sense amplifier 40 so as to provide a buffer output of a particular sensed bit within a corresponding bit array.

Turning now to the specific structure of the buffer circuit 182, it is seen that the output of the sense amplifying circuit 161 is applied to the base of an input transistor 184. The collector of the input transistor 184 is connected through a resistance 186 to a ground bus 188. The emitter of the input transistor 184 is connected through a resistance 190 to a negative voltage $V_S$. A transistor 192 is also connected between the ground bus 188 and the resistance 190. The base of the transistor 192 is biased by a reference voltage $V_R$ which allows it to be conductive when a low output voltage from the sense amplifying circuit 161 has been applied to the input transistor 184. The output of the buffer circuit 182 occurs at a point 194 upstream of the input transistor 184. The particular data bit which will appear at the output of the circuit 182 is denoted as D0. This data bit output will be relatively high for a sensed ZERO data bit and relatively lower for a sensed ONE data bit. These output signal levels for the sensed binary values are dictated by the sense amplifying circuit 161 which produces a high voltage level for a binary ONE and a low voltage level for a binary ZERO. These relative voltage levels are merely inverted at the point 194 of the output buffer circuit 182.

The output of the buffer circuit 182 is enabled by a transistor 196 having a collector connected to the output line and an emitter connected through the resistance 192 to the negative voltage $V_S$ so as to establish a current path from the point 194 through the transistor 196 to the negative voltage $V_S$. This path is normally conductive by virtue of a relatively high voltage level being applied to the base of the transistor 196 through a DATA ACCESS signal appearing at the terminal 44. This same DATA ACCESS signal activates the output buffer circuit 182 by producing a relatively low voltage at the base of the transistor 196 thereby deactivating it so as to cause the voltage level appearing at point 194 to be available as an accessed data bit D0.

As can be appreciated, the DATA ACCESS signal which is applied to the terminal 44 simultaneously enables 10 output buffer circuits within the output buffer 42 thereby making available the sensed data bits D0 through D9. These data bits have each been made available to their respective output buffer circuits through the sense amplifying circuits corresponding to the individual bit arrays 16 through 34.

Having now described the various circuitry of the READ ONLY memory in FIG. 2, values for the various resistive elements can be set forth:

| RESISTOR ELEMENTS | RESISTANCE VALUES IN OHMS |
|---|---|
| 56 | 250 |
| 56 | 279 |
| 60 | 260 |
| 68 | 770 |
| 70 | 770 |
| 74 | 500 |
| 80 | 770 |
| 108 | 154 |
| 110 | 172 |
| 114 | 770 |
| 126 | 161 |
| 128 | 770 |
| 130 | 770 |
| 136 | 350 |
| 162 | 350 |
| 164 | 417 |
| 166 | 370 |
| 174 | 330 |
| 176 | 330 |
| 180 | 330 |
| 186 | 61 |
| 190 | 285 |

The above resistive values define the circuit of FIG. 2 operating in a voltage environment wherein the voltage supply $V_S$ is equal to $-3.30$ volts and the reference voltage $V_R$ is set at $-0.26$ volts. The bit address signal levels A0 through A7 applied to the circuit are either 0 or $-0.5$ volts.

It is to be understood that while the above elements have been set forth with particularity in the preferred embodiment, substitutions and deletions can be made therefore without departing from the scope of the invention. For example, the Y buffer circuitry 102 appearing within the Y-buffer 36 could also be substituted for the X-buffer circuitry 48 appearing within the X-buffer 10. These and other substitutions could be made without departing from the scope of the invention.

OPERATION OF THE PREFERRED EMBODIMENT

Having now described the preferred embodiment, it is appropriate to turn to a description of how the same operates. For an addressed location of X=0 and Y=31, it is seen that the X bit address signals A0 through A2 will all be ZERO, whereas the Y bit address signals signals A3 through A7 will all be ONE. For illustrative purposes, and moreover for the sake of brevity, only the A0 bit address and the A3 bit address will be specifically analyzed.

The A0 address signal will be logically high for a bit ZERO thereby causing the transistor 50 to conduct as opposed to the transistor 52 being conductive. With the transistor 50 being conductive and the transistor 52 being non-conductive the transistor 64 will be rendered non-conductive whereas the transistor 66 will become conductive. With the transistor 66 being conductive, the A'0 output signal condition will be high. This A'0 output signal condition will not produce a current pull effect on the multi-emitter transistor 72 within the X-decoder circuit 71. In a similar manner, the buffer circuits within the X-buffer 10 receiving the X address signals A1 and A2 will also produce non-current pull conditions A'1 and A'2. The signal conditions A'0 through A'2 will render the multi-emitter transistor 72 non-conductive, thereby causing the base of the transistor 78 to go high. This will cause the transistor 78 to conduct thereby raising the voltage level at the X0 output of the X-decoder 12. The high X0 output will activate the X switch transistor 84.

Turning now to the Y address portion and in particular to the Y address bit, A3, which is ONE, thus dictating that the A3 address signal is to be low. With the A3 address signal low, the base of the transistor 104 will be low, whereas the base of the transistor 106 will be high. With the transistor 106 thereby being conductive, the base of the transistor 120 will go low. On the other hand, the base of the transistor 118 will go high, thereby producing an emitter current from the transistor 118 through the base of the transistor 124. The transistor 124 will draw collector current from the A'3 output line. At the same time, the transistor 122 will not conduct so as to not pull current from the $\overline{A'3}$ output line.

The other decode circuits within the Y-decoder 36 will similarly produce current pull signals on their respective output lines A'4, A'5, A'6 and A'7 in response to the address bits A4 through A7 being ONE. At the same time, there will not be any current pull on the respective negation outputs of $\overline{A'4}$, $\overline{A'5}$, $\overline{A'6}$ and $\overline{A'7}$.

The presence of the current pull conditions A'3 through A'7 will cause the multi-emitter transistors in all but one of the Y-decoder circuits to conduct thereby causing the respective Y conductors to go low. The only Y-decoder circuit not to experience a current pull will be the decoder circuit 144 for the conductor Y31. In this regard, the multi-emitter transistor for the Y-decoder circuit 140 will not receive a single one of the current pull signal conditions A'3 through A'7 but will rather receive the negations thereof.

With the Y31 conductor thus being conductive, and with the X switching transistor 84 having been previously activated, the emitter E0,31 will be sensed for either being closed or open with respect to the emitter line 144. For a closed emitter connection which is arbitrarily defined as storing a ONE bit a conductive path will be formed through the X switching transistor 84 to the current sink 100. With the multi-emitter transistor Q31 thus being conductive, the multi-emitter transistor 160 within the sense amplifier 40 will be off thereby causing the voltage level at the point 168 to be relatively high. With the output from the sense amplifier 40 being relatively high, the input transistor 184 of the output buffer circuit 182 will be activated thereby causing a low level signal at the point 194. This low level signal at the point 194 of the output buffer circuit 182 will be accessed as a data bit D0 equal to ONE when the DATA ACCESS signal applied to the terminal 44 goes logically low. The DATA ACCESS signal will also simultaneously make available the data bits D1 through D9 from the corresponding bit arrays 18 through 34.

What is claimed is:

1. A data storage system for accessing stored words consisting of n-bits of information, said system comprising:
   a plurality of means for storing each of the n-bits of information;
   means for receiving an address identifying the location of each of the n-bits of information in each of said plurality of storage means;
   means for selectively developing current paths through each of said plurality of storage means in response to said received address;
   said means for selectively developing current paths further comprising:
      means for applying a first electrical potential upstream of the particular addressed storage location within said storage means;
      means for applying a second electrical potential downstream of the particular addressed storage location within said storage means, said second electrical potential being lower than said first electrical potential so as to establish a current path through said particular addressed location;
   said means for applying a first electrical potential upstream of the particular addressed storage location still further comprising:
      a plurality of means for providing current from said first electrical potential to each of said storage means;
   said plurality of means for providing current from said first electrical potential to each of said storage means comprising:
      a plurality of conductive lines, each being conductively connected to said storage means;
      means for sensing each of said plurality of storage means to ascertain the conductive status of the selectively developed current path therein; each of said storage means comprising:
      a plurality of multi-emitter transistors each with a base being connected to one of said plurality of conductive lines; each of said storage means further comprising:
      a plurality of emitter lines each of which is conductively closed with respect to at least one of the emitters of said multi-emitter transistors.

2. The system of claim 1 wherein said means for sensing the conductive status of the selectively developed current paths comprises:
   means for developing second current paths through each of said bit storage means, said second current paths being conductive when said current paths through said particular addressed locations are non-conductive.

3. The system of claim 1 wherein each of said means for sensing a storage means comprises:
   a multi-emitter transistor having a plurality of emitters conductively connected to said plurality of emitter lines within the particular storage means.

4. The system of claim 3 wherein said means for applying a second electrical potential downstream of the particular addressed location comprises:
   means, responsive to said received address, for conductively connecting only one of said emitter lines within each of said storage means to said second electrical potential.

5. The system of claim 4 wherein said means for conductively connecting only one of said emitter lines comprises:
   a plurality of switching means, each being connected to a respective emitter line, for conductively connecting the respective emitter line to said second electrical potential; and a plurality of means for activating only one of said switching means in response to the received address.

6. The system of claim 5 wherein said plurality of activating means each comprise:
means for providing activation signals to said plurality of switching means; and
means for inverting said activation signals in response to the address present in said receiving means.

7. The system of claim 6 wherein said means for receiving an address comprises:
means for decoding the address, said decoding means being operative to selectively draw current from said plurality of inverting means so as to cause all but one of the activation signals to deactivate a corresponding switching means.

8. The system of claim 7 wherein said decoding means comprises:
means for receiving a bi-level address signal representative of a particular address bit; and
a pair of current pull means, connected to said receiving means, for producing current mode logic assertion and negation signal conditions of each address bit, said signal conditions being selectively applied to said inverting means.

9. The system of claim 1 wherein the address comprises a plurality of bi-level address signals each of which corresponds to a particular address bit, and said means for receiving an address comprises:
means, connected to at least two different means for providing current from said first electrical potential and being responsive to a particular bi-level address signal, for drawing current from only one of said two different means for providing current from said first electrical potential.

10. The system of claim 9 wherein said means for drawing current from only one of said two different means for providing current from said first electrical potential depending on the level of the particular bi-level address signal comprises:
first means, connected to the first of said two means for providing current, for conductively drawing current therefrom;
second means, connected to the second of said two means for providing current, for conductively drawing current therefrom; and
means for receiving said bi-level signal, said receiving means being operative to select one of said first and second means for conductively drawing current.

11. The system of claim 10 wherein said first and second means for drawing current comprises:
a pair of emitter-follower transistors with respective bases being connected to said means for receiving said bi-level signal; and
a pair of cross-coupled transistors with bases being connected to the emitter outputs of said pair of emitter-follower transistors.

12. The system of claim 11 wherein said receiving means comprises:
a pair of differentially-coupled transistors wherein the first transistor base receives said bi-level signal and the second transistor base is biased by a reference voltage set between the voltage levels of said bi-level signal.

13. The system of claim 1 wherein said means for applying a second electrical potential downstream of the particular addressed storage location comprises:

a plurality of switching means for switching a particular addressed storage location into conductive relationship with said second electrical potential;
a plurality of means for activating a corresponding switching means, said plurality of activating means being operative to activate only one of said switching means at any given time;
means for providing activation signals to said plurality of switching means; and
means for inverting said activation signals in response to the address present in said receiving means.

14. The system of claim 13 wherein said means for receiving an address comprises:
means for decoding the address, said decoding means being operative to selectively draw current from said plurality of inverting means so as to cause all but one of the activation signals to deactivate a corresponding switching means.

15. The system of claim 14 wherein said decoding means comprises:
means for receiving a bi-level address signal representative of a particular address bit; and
a pair of current pull means, connected to said receiving means, for producing current mode logic assertion and negation signal conditions of each address bit, said signal conditions being selectively applied to said inverting means.

16. In a data storage device wherein data bits are electronically stored in a matrix array having bit storage locations therein defined by a first address and a second address, apparatus for accessing and sensing the stored bits said apparatus comprising:
a plurality of current source means for providing electrical current to said bit storage locations;
means, responsive to the first address, for drawing current from said plurality of current source means so as to deactivate all but one of said plurality of current source means;
a plurality of means for drawing current from said bit storage locations;
means, responsive to the second address, for selectively activating one of said plurality of means for drawing current from said bit storage locations; and
means for sensing the conductive status of the bit storage location having both the first and second addresses;
said first and second addresses each further comprising a plurality of bi-level address signals each of which corresponds to a particular bit of one of said first and second addresses and said means responsive to said first address for drawing current from said current source means comprises:
means, connected to at least two different current source means and being responsive to a particular bi-level address signal, for drawing current from only one of said two current source means depending on the signal level of said bi-level signal.

17. The apparatus of claim 16 wherein said means for drawing current from only one of said two current source means depending on the signal level of said bi-level signal comprises:
first means, connected to the first of said two current source means, for conductively drawing current therefrom;
second means connected to the second of said two current source means for conductively drawing current therefrom; and means for receiving said bi-level signal, said receiving means being operative to select one of said first and second means for conductively drawing current from respective current source means.

18. The apparatus of claim 17 wherein said first and second means for drawing current comprises:
   a pair of emitter-follower transistors with respective bases being connected to said means for receiving said bi-level signal; and
   a pair of cross-coupled transistors with bases being connected to the emitter outputs of said pair of emitter-follower transistors.

19. The apparatus of claim 18 wherein said receiving means comprises:
   a pair of differentially-coupled transistors wherein the first transistor base receives said bi-level signal and the second transistor base is biased by a reference voltage set between the voltage levels of said bi-level signal.

20. The apparatus of claim 16 wherein said plurality of means for drawing current from said bit storage means each comprise:
   means for switching a plurality of bit storage locations corresponding to a particular second address into conductive relationship with a current sink.

21. The apparatus of claim 20 wherein said means, responsive to the second address, for selectively activating one of said plurality of means for drawing current from said bit storage locations comprises:
   a plurality of means for providing activation signals to said plurality of switching means; and
   a plurality of means for inverting said activation signals in response to a decoded second address.

22. The apparatus of claim 21 wherein said means, responsive to the second address, for selectively activating one of said plurality of means for drawing current from said bit storage locations comprises:
   means for decoding the second address, said decoding means being operative to selectively draw current from said plurality of inverting means so as to cause all but one of said bi-level activation signals to deactivate corresponding switching means.

23. The apparatus of claim 22 wherein said means for decoding the second address comprises:
   means for receiving a bi-level address signal representative of a particular address bit; and
   a pair of current pull means, connected to said receiving means, for producing a current mode logic assertion and negation signal conditions of each address bit, said signal conditions being selectively applied to said inverting means.

* * * * *